(12) United States Patent
Frantz et al.

(10) Patent No.: US 9,676,227 B2
(45) Date of Patent: Jun. 13, 2017

(54) WET-ETCHABLE, SACRIFICIAL LIFTOFF LAYER COMPATIBLE WITH HIGH TEMPERATURE PROCESSING

(71) Applicants: Jesse A. Frantz, Landover, MD (US); Jason D. Myers, Alexandria, VA (US); Robel Y. Bekele, Washington, DC (US); Jasbinder S. Sanghera, Ashburn, VA (US)

(72) Inventors: Jesse A. Frantz, Landover, MD (US); Jason D. Myers, Alexandria, VA (US); Robel Y. Bekele, Washington, DC (US); Jasbinder S. Sanghera, Ashburn, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 408 days.

(21) Appl. No.: 14/201,009

(22) Filed: Mar. 7, 2014

(65) Prior Publication Data

US 2014/0263171 A1    Sep. 18, 2014

Related U.S. Application Data

(60) Provisional application No. 61/786,824, filed on Mar. 15, 2013.

(51) Int. Cl.
*B44C 1/22* (2006.01)
*H01L 31/0392* (2006.01)
*H01L 31/18* (2006.01)
*H01L 21/02* (2006.01)

(52) U.S. Cl.
CPC ........ *B44C 1/227* (2013.01); *H01L 31/03928* (2013.01); *H01L 31/1896* (2013.01); *H01L 21/02002* (2013.01); *Y02E 10/541* (2013.01)

(58) Field of Classification Search
None
See application file for complete search history.

(56) References Cited

U.S. PATENT DOCUMENTS

| 6,656,271 B2 * | 12/2003 | Yonehara et al. | 117/94 |
| 7,033,961 B1 * | 4/2006 | Smart et al. | 438/796 |
| 2005/0156246 A1 * | 7/2005 | Lochtefeld et al. | 257/347 |

* cited by examiner

*Primary Examiner* — Duy Deo
(74) *Attorney, Agent, or Firm* — US Naval Research Laboratory; Roy Roberts

(57) ABSTRACT

A method for forming a wet-etchable, sacrificial lift-off layer or layers compatible with high temperature processing, a sacrificial layer, defined as consisting of a single film of one material or multiple films of multiple materials, that can tolerate high temperatures, is deposited on a substrate, called the original substrate, by sputtering or another suitable technique (e.g. evaporation, pulsed laser deposition, wet chemistry, etc.). Intermediate steps result in a lift-off layer attached to the lift-off substrate, that allow for separating the product from the original substrate.

13 Claims, 5 Drawing Sheets

WET-ETCHABLE, SACRIFICIAL LIFTOFF LAYER COMPATIBLE WITH HIGH TEMPERATURE PROCESSING

CROSS-REFERENCE TO RELATED APPLICATIONS

This application claims the benefit of U.S. Provisional Application 61/786,824 filed on Mar. 15, 2013, the entirety of which is incorporated herein by reference.

BACKGROUND

Methods and systems disclosed herein relate generally to forming a wet-etchable, sacrificial lift-off layer or layers compatible with high temperature processing, and forming a new product having a single or multi-layer film produced with this sacrificial layer.

In thin film processing, various situations arise when it is desirable to deposit a film on one substrate and eventually transfer it to another. The original substrate may be chosen for properties such as tolerance to high temperatures or coefficient of thermal expansion while the new substrate may be chosen for other properties such as flexibility. In such situations, a lift-off process may be used. A sacrificial film is applied to the original substrate prior to deposition of the lift-off layer. Such processes have been developed for epitaxial growth. (J. J. Schermer, P. Mulder, G. J. Bauhuis, M. M. A. J. Voncken, J. van Deelen, E. Haverkamp, and P. K. Larsen, "Epitaxial Lift-Off for large area thin film III/V devices," *Phys. Stat. Sol.* (a), 202, pp. 501-508 (2005).) These methods are extremely expensive and only apply for substrates, sacrificial layers, and lift-off layers that are grown epitaxially. Processes have also been developed that use polymer lift-off layers that are compatible only with low temperatures. (V. Linder, B. D. Gates, D. Ryan, B. A. Parviz, and G. M. Whitesides, "Water-soluble sacrificial layers for surface micromachining," *Small*, 1, pp. 730-736 (2005).)

There are not currently non-epitaxial methods for forming a sacrificial layer for liftoff that are tolerant to high temperatures. This technology is badly needed. For instance, in the field of thin film photovoltaics (PV), copper indium gallium diselenide (CIGS) is typically grown on a soda lime glass (SLG), optimally at a substrate temperature of 550° C. If one wants to grow CIGS on a flexible substrate such as polyimide (PI), the temperature must be lowered resulting in sub-optimal performance. What is needed is a lift-off process that would allow CIGS to be grown at high temperature and transferred to a PI substrate. The technology is also needed in the field of flexible electronics where the choice of materials is often limited to what temperature the flexible substrate can tolerate.

BRIEF SUMMARY

The system and method of the present embodiment for forming a wet-etchable, sacrificial lift-off layer or layers compatible with high temperature processing, a sacrificial layer, defined as consisting of a single film of one material or multiple films of multiple materials, that can tolerate high temperatures, is deposited on a substrate, called the original substrate, by sputtering or another suitable technique (e.g. evaporation, pulsed laser deposition, wet chemistry, etc.). If the sacrificial layer contains multiple films, they may be etchable in the same or different etchants or solvents. The sacrificial layer may comprise an acid soluble glass (ASG)—a glass composition tailored so that it has a high etch rate in HCl, HF, nitric, or another suitable acid. A diffusion barrier layer such as silica ($SiO_x$), other metal oxides, metal nitrides, or a metal may then be deposited to prevent the diffusion of ions or atoms during subsequent processing steps. This diffusion barrier layer also becomes part of the sacrificial layer. This diffusion barrier may also be etchable in acid or another suitable etchant. A single layer or multilayer stack of films, called the lift-off layer, is subsequently deposited onto the sacrificial layer. The lift-off layer is then bonded to a new substrate, called the lift-off substrate, with an adhesive, and the sacrificial layer is etched, resulting in a lift-off layer attached to the lift-off substrate. The product is separated from the original substrate. The new substrate with the liftoff layer can be further processed thermally up to a suitable temperature to complete the bonding, provide annealing and/or to provide improved performance.

The method of the present embodiment can permit a lift-off process for lift-off layers that require high deposition temperatures, in the range of 100° C.-1000° C. The method is cost effective in comparison with epitaxial lift-off processes, and permits the use of a large variety of original substrates that may be either crystalline or non-crystalline such as glass, metal, crystalline silicon, III-V materials, etc. The method of the present embodiment also can permit the use of a large variety of sacrificial layers, such as silicate glasses containing sodium silicate, fluoride glasses, phosphate glasses, chalcogenide glasses, etc., with different properties including coefficients of thermal expansion, suitable etchants, and usable temperature range.

In one embodiment, a method of lift-off includes depositing a sacrificial layer on an original substrate, depositing a lift-off layer onto the sacrificial layer at a substrate temperature between 100° C. and 1000° C., bonding the lift-off layer to a lift-off substrate using an adhesive, and etching the sacrificial layer to obtain the lift-off layer attached to the lift-off substrate, wherein at least one of said depositing steps occurs under non-epitaxial conditions.

In another embodiment, a method depositing a sacrificial layer on an original substrate, depositing a lift-off layer onto the sacrificial layer at a substrate temperature between 100° C. and 1000° C., wherein the lift-off layer comprises copper indium gallium diselenide, $Cu_2ZnSn(S,Se)_4$, cadmium telluride, iron disulfide, or a transparent conducting oxide, bonding the lift-off layer to a lift-off substrate using an adhesive, and etching the sacrificial layer to obtain the lift-off layer attached to the lift-off substrate, wherein at least one of said depositing steps occurs under non-epitaxial conditions.

In a further embodiment, a method of lift-off includes depositing a sacrificial layer of acid soluble glass on an original substrate, depositing a lift-off layer comprising copper indium gallium diselenide onto the sacrificial layer at a substrate temperature of 550° C., bonding the lift-off layer to a lift-off substrate using an adhesive, and etching the sacrificial layer to obtain the lift-off layer attached to the lift-off substrate.

DETAILED DESCRIPTION

Definitions

Before describing the present invention in detail, it is to be understood that the terminology used in the specification is for the purpose of describing particular embodiments, and is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used in this specification and the appended claims, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

DESCRIPTION

Figure 1:
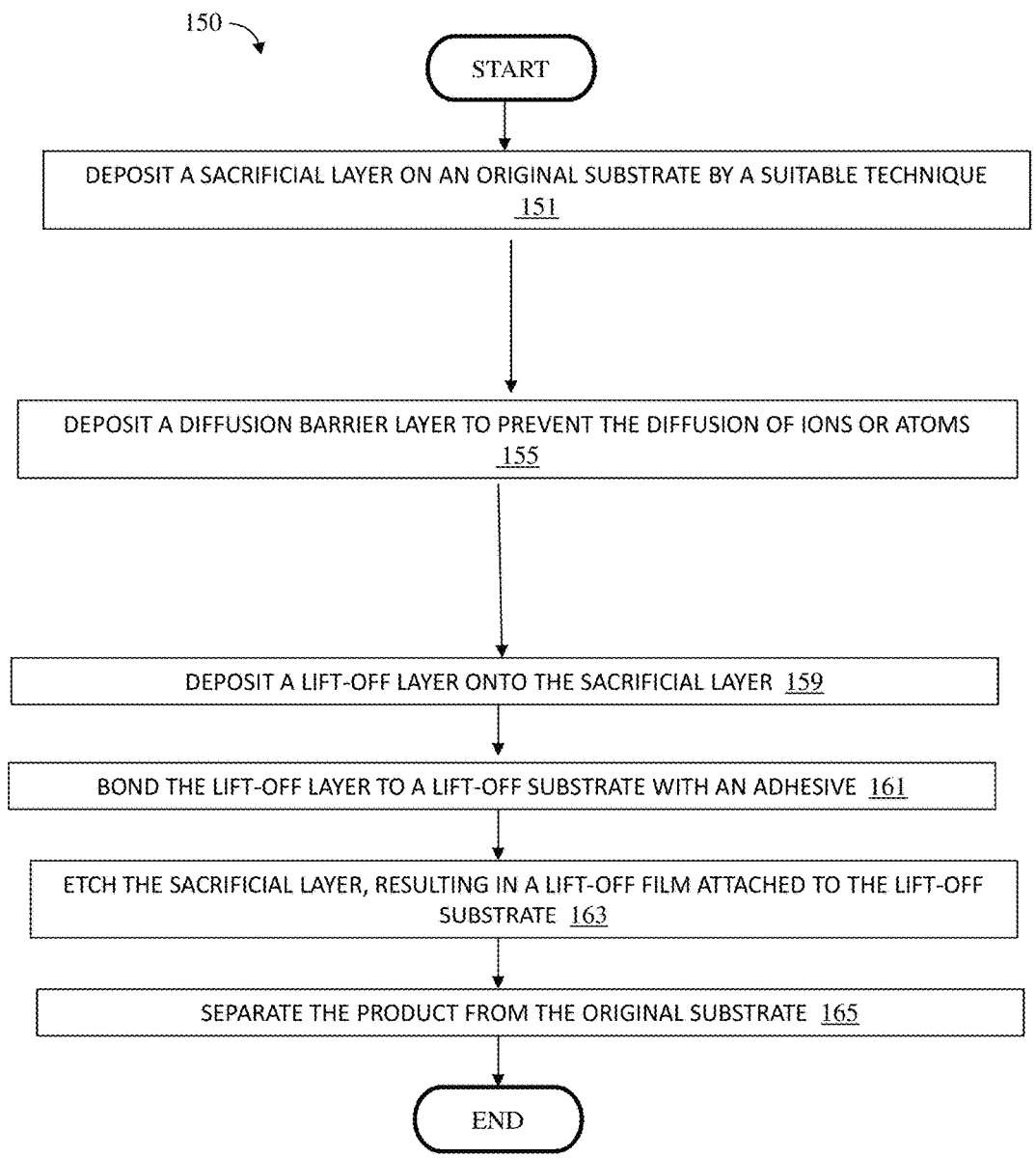
FIG. 1 is a flowchart of the method of the present embodiment.

Referring now to FIG. 1, method 150 of the present embodiment for forming a wet-etchable, sacrificial lift-off layer or layers compatible with high temperature processing, can include depositing 151 a sacrificial layer on an original substrate by a suitable technique. If the sacrificial layer contains multiple films, method 150 can include etching the multiple films in etchants or solvents. Method 150 can further include depositing 155 a diffusion barrier layer to prevent the diffusion of ions or atoms, depositing 159 a lift-off layer onto the sacrificial layer, bonding 161 the lift-off layer to a lift-off substrate with an adhesive, etching 163 the sacrificial layer, resulting in a lift-off layer attached to the lift-off substrate, and separating 165 the product from the original substrate. In embodiments, the diffusion barrier is also etched in a suitable etchant.

Optionally, the method can include processing the new substrate with the liftoff layer thermally up to a suitable temperature to complete the bonding, providing annealing and/or providing improved performance. The depositing of the sacrificial layer can be accomplished by sputtering or another suitable technique (e.g. evaporation, pulsed laser deposition, wet chemistry, etc.). The sacrificial layer may include an acid soluble glass (ASG)—a glass composition tailored so that it has a high etch rate in HCl, HF, nitric, or another suitable acid. The diffusion layer can include, for example, but not limited to, silica ($SiO_x$), other metal oxides, metal nitrides, or a metal. The diffusion barrier layer can become part of the sacrificial layer. The suitable etchant can include acid.

Figure 2:
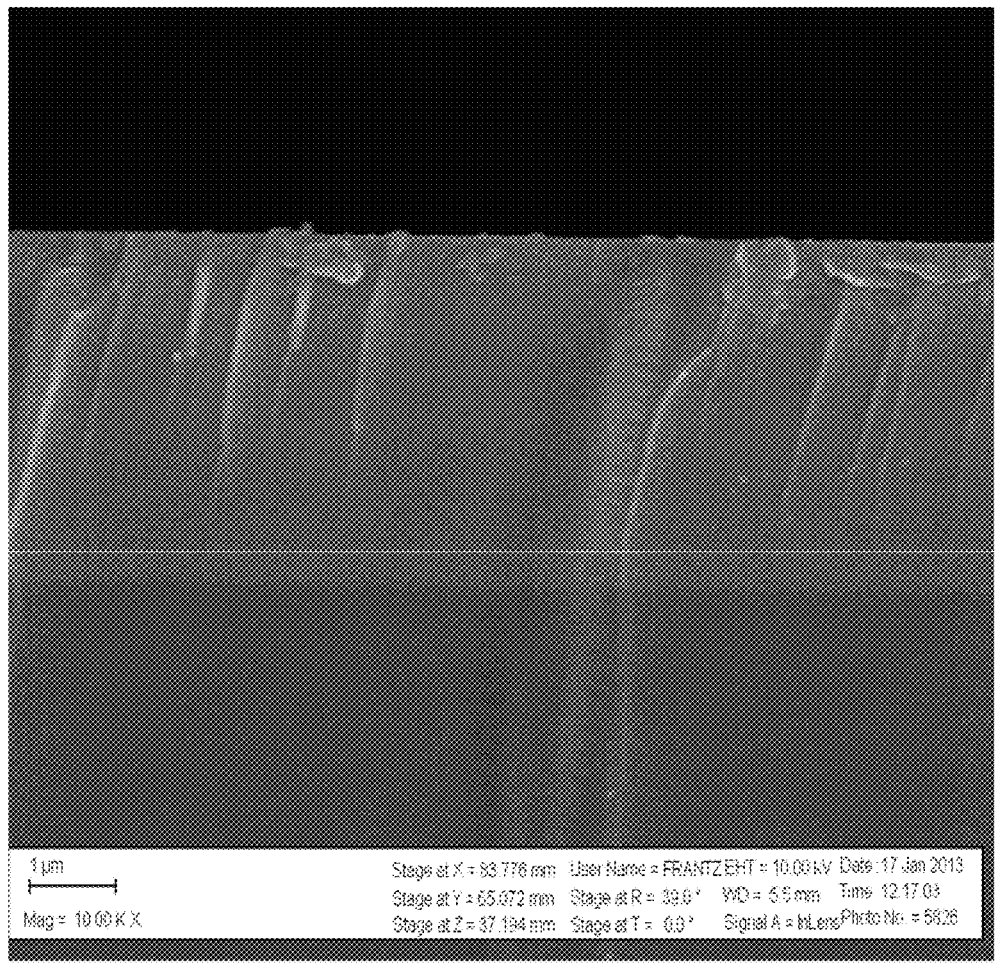
FIG. 2 is a photographic example of an SEM cross sectional image of a ~3 μm thick film of ASG on an SLG substrate.

Referring now to FIG. 2, a cross sectional scanning electron microscope (SEM) image of an ASG layer on an SLG substrate is shown. A billet of ASG (Pegasus Glassworks, Inc., glass composition PM11) is formed into a sputtering target that is 3" in diameter and ⅛" thick. The target is then bonded to a ⅛" thick copper backing plate. A 1" square by 1.6 mm thick piece of soda lime glass (SLG), used as the original substrate, is cleaned in subsequent solutions of surfactant, deionized water, acetone, and isopropanol. A layer of ASG, approximately 2-4 μm thick, is sputtered onto the substrate to serve as the sacrificial layer. A layer of Mo, approximately 600 nm thick, is then sputtered onto the surface at room temperature to serve as the lift-off layer. The sample is then removed from the deposition system.

Figure 3:
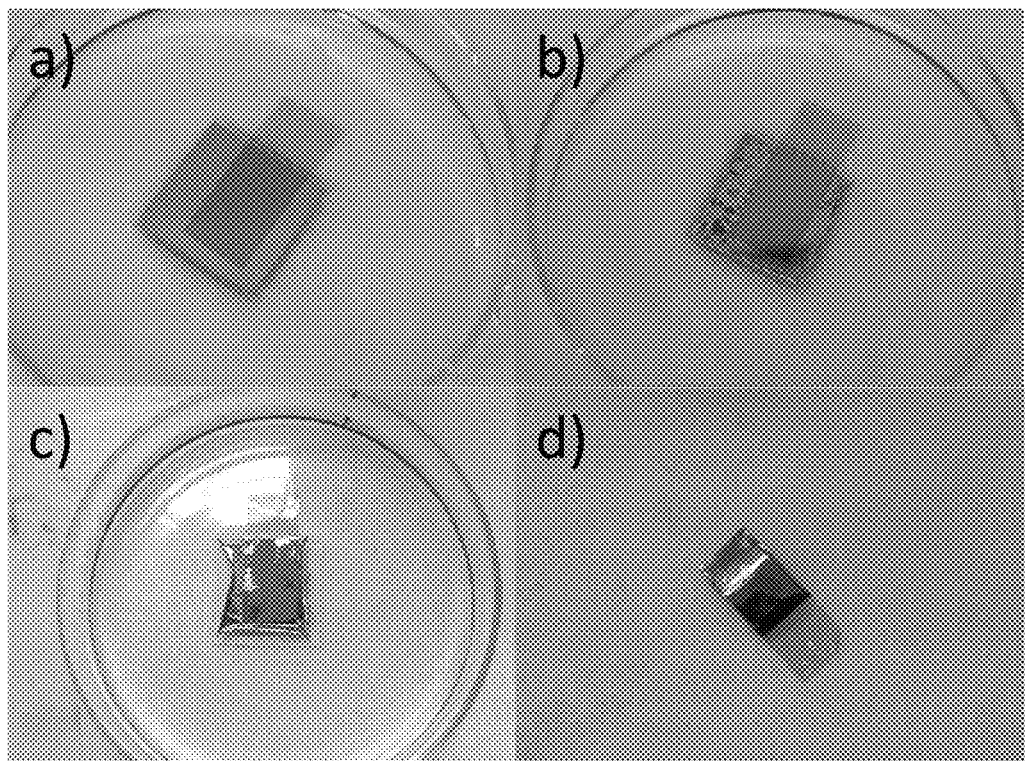
FIGS. 3(*a*)-3(*d*) are photographic images of the lift-off of a Mo film from a SLG substrate.

Referring now to FIGS. 3(a)-3(d), images of the lift-off process are shown at various stages of the etch process. The ASG lift-off layer is etched in HCl. The images were taken at a) 0 min., b) 4 min., c) 30 min., and d) after completion of the 3.5 hour etch. A piece of ½" wide, 1 mil thick Kapton polyimide tape serves as the lift-off substrate and is adhered to part of the Mo surface using the tape's adhesive. The sample is etched in an $HCL:H_2O$, 1:10 solution for approximately 3.5 hours. This process dissolves the ASG and separates the lift-off layer and lift-off substrate from the SLG substrate. The Mo film begins to separate from the soda lime substrate as the ASG is etched. The sample, just after being placed in the HCl solution is shown in FIG. 3(a). The portion of the film that is not under the tape is visibly separating in FIG. 3(b), while the film under the tape is partially etched in FIG. 3(c). The lift-off layer on the lift-off substrate, separated from the SLG substrate is shown in FIG. 3(d).

Figure 4:
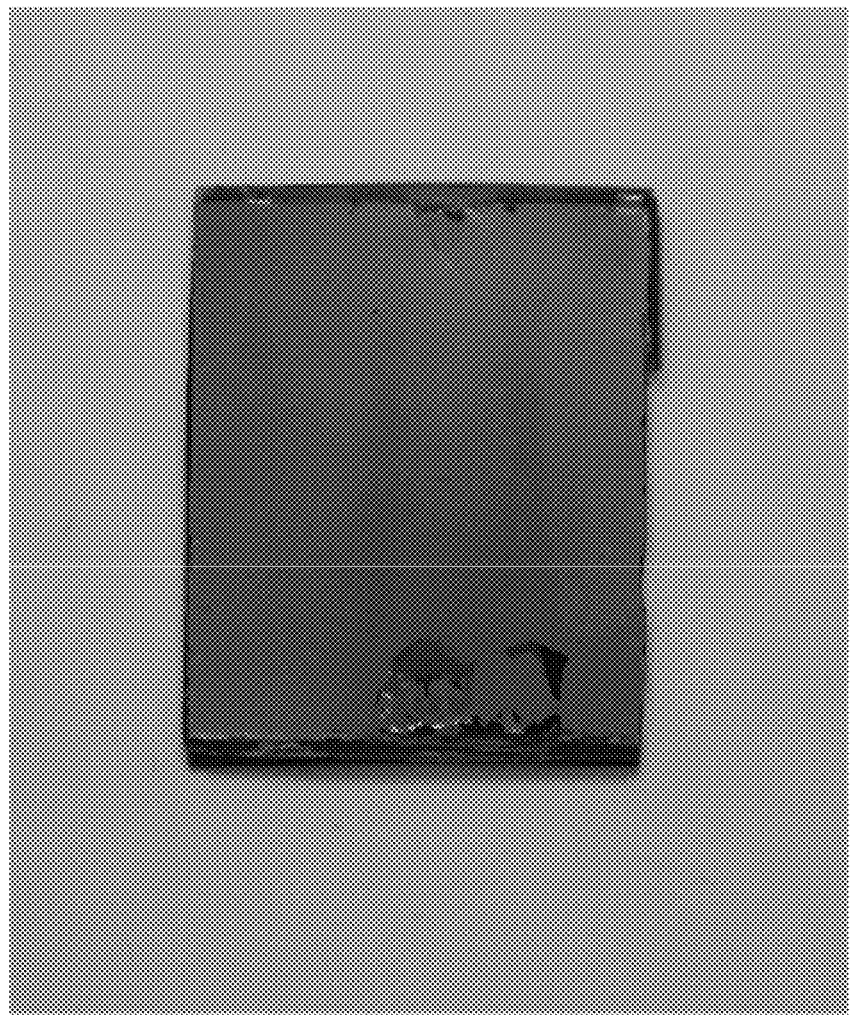
FIG. 4 is a photographic image of a lift-off CIGS/Mo bilayer on a PI substrate.
Figure 5:
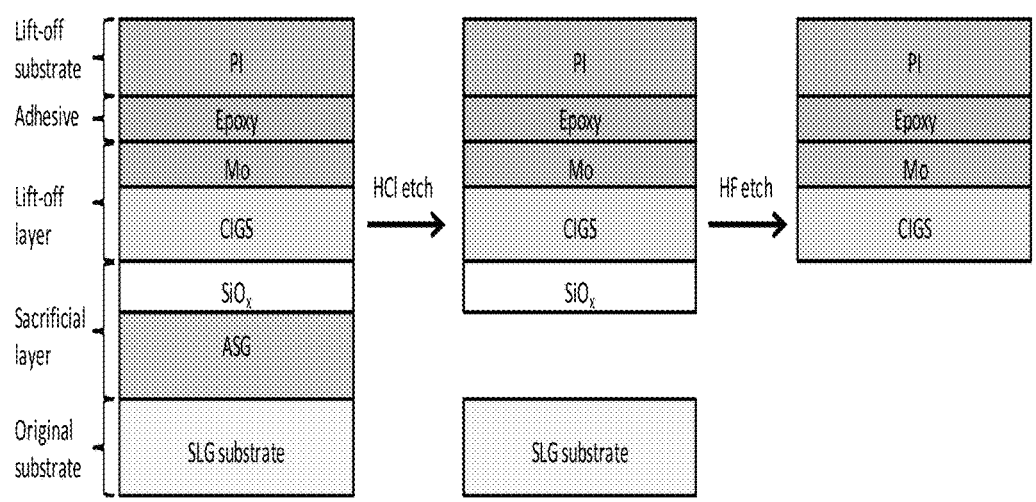
FIG. 5 is a schematic diagram of an example of a lift-off process.

Referring now to FIGS. 4 and 5, a photograph of the product is shown (FIG. 4) and a schematic diagram of the process by which the product was formed is shown (FIG. 5). The SLG substrate is the original substrate, the ASG and $SiO_x$ together are the sacrificial layer, the CIGS and Mo are the lift-off layer, the epoxy is the adhesive, and the PI is the lift-off substrate. A billet of ASG (Pegasus Glassworks, Inc., glass composition PM11) is formed into a sputtering target that is 3" in diameter and ⅛" thick. The target is then bonded to a ⅛" thick copper backing plate. A 1" square by 1.6 mm thick piece of soda lime glass, used as the original substrate, is cleaned in subsequent solutions of surfactant, deionized water, acetone, and isopropanol. A layer of ASG, approximately 4 μm thick, is sputtered onto the substrate. A layer of $SiO_x$, approximately 100 nm thick, is deposited on the sample via E-beam evaporation. The ASG and $SiO_x$ together comprise the sacrificial layer. A 2 μm thick CIGS film is then RF sputtered from a quaternary target onto the sample while maintaining a substrate temperature of 550° C. at a power of 150 W. A layer of Mo, approximately 600 nm thick, is then sputtered onto the surface at room temperature. The CIGS and Mo together comprise the lift-off layer. The sample is then removed from the deposition system. A 1" square of flexible polyimide (PI) is bonded to the lift-off layer (directly to the Mo layer) with EPO-TEK 353-ND epoxy, and the epoxy is cured on a hot plate at a temperature of approximately 150° C. for 30 minutes. The PI serves as the lift-off substrate, and the epoxy is the adhesive. The sample is etched in reagent strength hydrochloric acid (HCl) for approximately 20 hours. This process dissolves the ASG and separates the lift-off layer, lift-off substrate, and $SiO_x$ from the original substrate. The sample is then etched in an $HF:H_2O$, 1:1 solution for 30 s to dissolve the $SiO_x$ layer. The resulting product is the lift-off layer (a CIGS/Mo bilayer) on the lift-off substrate (a flexible PI substrate). In this example, the CIGS was deposited at a substrate temperature of 550° C.—a temperature that the PI lift-off substrate could not withstand.

Any suitable glass composition that yields a wet-etchable film could be used for the lift-off layer. The lift-off layer could be base-soluble, water soluble, or organic soluble, rather than acid-soluble. The lift-off layer could consist solely of $SiO_x$. The lift-off substrate could be bonded to the lift-off layer with any suitable method, such as those based on silicone, polyurethane, thermoplastics, or pressure sensitive adhesives, rather than epoxy. During etching, force may be applied to aid in separation of the lift-off layer and the original substrate. Lift-off could be performed on a lift-off layer that is not bonded to a lift-off substrate, and the free film could be attached to a new substrate via adhesive, van der Waals forces, or friction. Lift-off could be performed on a lift-off layer that is not bonded to a lift-off substrate, and the free film could be used in flake or suspension form. The lift-off layer could be patterned via shadow mask, lithography or any other suitable means prior to lift-off. For PV applications, CIGS could be deposited via any suitable technique, such as evaporation, electrodeposition, etc., rather than sputtering. For PV applications other photovoltaic materials including, but not limited to, CZTS ($Cu_2ZnSn(S,Se)_4$), cadmium telluride, and iron disulfide can be used instead of CIGS. Non-photovoltaic films, such as transparent conducting oxides, can be used as the lift-off layer.

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

What is claimed is:

1. A method of lift-off comprising:
   depositing a sacrificial layer on an original substrate,
   depositing a lift-off layer onto the sacrificial layer at a substrate temperature between 100° C. and 1000° C.,
   bonding the lift-off layer to a lift-off substrate using an adhesive, and
   etching the sacrificial layer to obtain the lift-off layer attached to the lift-off substrate,
   wherein at least one of said depositing steps occurs under non-epitaxial conditions, and
   wherein the etching is sufficient to separate the lift-off layer and the lift-off substrate from the original substrate.

2. The method of claim 1, wherein one or both of said depositing steps occur by sputtering, evaporation, electrodeposition, pulsed laser deposition, or wet chemistry.

3. The method of claim 1, wherein the sacrificial layer is an acid soluble glass and wherein said etching is accomplished using acid.

4. The method of claim 3, wherein said glass is selected from the group consisting of fluoride glasses, phosphate glasses, chalcogenide glasses, and silicate glasses containing sodium silicate.

5. The method of claim 1, further comprising depositing a diffusion barrier between said sacrificial layer and said lift-off layer, wherein said etching also removes the diffusion barrier.

6. The method of claim 1, wherein the lift-off layer comprises copper indium gallium diselenide.

7. The method of claim 1, further comprising patterning the lift-off layer.

8. A method of lift-off comprising:
   depositing a sacrificial layer on an original substrate,
   depositing a lift-off layer onto the sacrificial layer at a substrate temperature between 100° C. and 1000° C., wherein the lift-off layer comprises copper indium gallium diselenide, $Cu_2ZnSn(S,Se)_4$, cadmium telluride, iron disulfide, or a transparent conducting oxide,
   bonding the lift-off layer to a lift-off substrate using an adhesive, and
   etching the sacrificial layer to obtain the lift-off layer attached to the lift-off substrate,
   wherein at least one of said depositing steps occurs under non-epitaxial conditions, and
   wherein the etching is sufficient to separate the lift-off layer and the lift-off substrate from the original substrate.

9. The method of claim 8, wherein one or both of said depositing steps occur by sputtering, evaporation, electrodeposition, pulsed laser deposition, or wet chemistry.

10. The method of claim 8, wherein the sacrificial layer is an acid soluble glass and wherein said etching is accomplished using acid.

11. The method of claim 8, further comprising depositing a diffusion barrier between said sacrificial layer and said lift-off layer, wherein said etching also removes the diffusion barrier.

12. The method of claim 1, wherein the lift-off layer comprises said copper indium gallium diselenide.

13. The method of claim 8, further comprising patterning the lift-off layer.

* * * * *